US012780350B2

(12) United States Patent
Manewald et al.

(10) Patent No.: US 12,780,350 B2
(45) Date of Patent: Nov. 3, 2026

(54) METHOD FOR DETERMINING A PEDALING FREQUENCY OF A BICYCLE

(71) Applicant: Robert Bosch GmbH, Stuttgart (DE)

(72) Inventors: Merlin Martin Manewald, Reutlingen (DE); Felix Dauer, Tuebingen (DE); Jo Pletinckx, Sersheim (DE); Juergen Stegmaier, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 394 days.

(21) Appl. No.: 18/507,028

(22) Filed: Nov. 11, 2023

(65) Prior Publication Data

US 2024/0166300 A1 May 23, 2024

(30) Foreign Application Priority Data

Nov. 18, 2022 (DE) ..................... 10 2022 212 294.1

(51) Int. Cl.
*B62M 6/50* (2010.01)
*G01R 23/02* (2006.01)

(52) U.S. Cl.
CPC ............... *B62M 6/50* (2013.01); *G01R 23/02* (2013.01)

(58) Field of Classification Search
CPC ......... B62M 6/50; G01R 23/02; B62J 45/412; B62J 45/413
See application file for complete search history.

(56) References Cited

U.S. PATENT DOCUMENTS

| | | | | |
|---|---|---|---|---|
| 2011/0093100 | A1* | 4/2011 | Ramsay | G10H 1/0008 700/94 |
| 2016/0143579 | A1* | 5/2016 | Martikka | A61B 5/0245 600/301 |
| 2016/0375957 | A1 | 12/2016 | Hashimoto et al. | |
| 2018/0259546 | A1* | 9/2018 | Corno | G01P 3/489 |
| 2018/0376045 | A1* | 12/2018 | Weckel | H04N 23/684 |
| 2020/0259984 | A1* | 8/2020 | Weckel | H04N 23/684 |
| 2020/0262516 | A1* | 8/2020 | Hahn | B62M 9/122 |

FOREIGN PATENT DOCUMENTS

| | | | | |
|---|---|---|---|---|
| CN | 106404246 A * | 2/2017 | | G01L 3/00 |
| DE | 102014212760 A1 * | 3/2015 | | B60W 40/105 |
| DE | 10 2016 010 962 A1 | 3/2017 | | |
| DE | 10 2021 200 318 A1 | 7/2022 | | |
| EP | 2532576 A1 * | 12/2012 | | B60L 50/20 |

(Continued)

OTHER PUBLICATIONS

Greiner , Verfahren Und Vorrichtung Zur Plausibilisierung Von Geschwindigkeitsdaten, Mar. 19, 2015, EPO, DE 102014212760 A1, Machine Translation of Description (Year: 2015).*

(Continued)

*Primary Examiner* — John Olszewski
*Assistant Examiner* — Matthew D Lee
(74) *Attorney, Agent, or Firm* — Maginot, Moore & Beck LLP

(57) ABSTRACT

A method for determining a pedaling frequency of a bicycle, in particular an e-bike, includes (i) determining a movement signal representing a chronological progression of a locomotion of the bicycle, (ii) determining a frequency spectrum of the movement signal, and (iii) determining a pedaling frequency based on the determined frequency spectrum.

18 Claims, 3 Drawing Sheets

(56) References Cited

FOREIGN PATENT DOCUMENTS

| | | | | | |
|---|---|---|---|---|---|
| EP | 4032795 | A1 * | 7/2022 | .............. | B62M 6/55 |
| JP | 2006340903 | A * | 12/2006 | ........... | G01C 21/183 |
| KR | 10-2018-0081280 | A | 7/2018 | | |
| WO | WO-2012019654 | A1 * | 2/2012 | .............. | G01P 1/023 |
| WO | WO-2016096454 | A1 * | 6/2016 | ........... | A61B 5/1118 |

OTHER PUBLICATIONS

Efken , Detection of Sensor Manipulation of an Electric Bicycle, Jul. 27, 2022, EPO, EP 4032795 A1, Machine Translation of Description (Year: 2022).*

* cited by examiner

METHOD FOR DETERMINING A PEDALING FREQUENCY OF A BICYCLE

This application claims priority under 35 U.S.C. § 119 to patent application no. DE 10 2022 212 294.1, filed on Nov. 18, 2022 in Germany, the disclosure of which is incorporated herein by reference in its entirety.

BACKGROUND

The present disclosure relates to a method for determining a pedaling frequency of a bicycle, and to a bicycle.

The detection of pedaling frequencies on bicycles using dedicated sensors is known. For example, a common revolution sensor, such as a reed sensor, can be used. The pedaling frequency can be detected for purely informative purposes in order to, e.g., be able to display relevant information to the rider from an athletic point of view. It is also known, particularly in the case of electric bikes comprising a drive unit for assisting a riding torque generated by a rider by means of motor force, to control the provision of the motor torque on the basis of various parameters, including the pedaling frequency, etc.

SUMMARY

The method according to the disclosure is characterized in that a particularly simple and cost-efficient option is created for precisely determining a pedaling frequency on a bicycle. In particular, additional sensors for capturing the pedaling frequency can be omitted. This is achieved according to the present disclosure by a method for determining a pedaling frequency of a bicycle, preferably an electric bike, comprising the following steps:

- determining a movement signal representing a chronological progression of a locomotion of the bicycle,
- determining a frequency spectrum of the movement signal, and
- determining a pedaling frequency based on the determined frequency spectrum.

In other words, the method captures a chronological progression of a locomotion, e.g. a speed of the bicycle, e.g. by means of a speed sensor. Preferably, this is performed by means of a high chronological resolution, which is in particular a multiple of a maximum expected pedaling frequency, which is usually pedaled by a rider of the bicycle. The instantaneous speed is represented by, e.g., the movement signal. This movement signal is analyzed in the method with respect to its frequency spectrum. In particular, characteristic frequency components of the movement signal can be determined. The frequency spectrum is then used to determine the instantaneous pedaling frequency at which a rider of the bicycle operates the pedals.

In particular, the determination of the pedaling frequency is based on the assumption that during pedal operation by the rider, the instantaneous speed fluctuates on the basis of the instantaneous muscle power applied. The pedal torque is in particular dependent on the instantaneous pedal position. In other words, if the pedals are horizontal, for example, the rider pedals at maximum pedal force such that the maximum pedal torque is present in this position, whereas if the pedals are in the vertical position, the rider applies a smaller pedal force to the pedals such that the minimum pedal torque is present in this position. These fluctuations of the pedal torque affect the acceleration and thus the subsequent speed of the bicycle. By the corresponding analysis of the movement signal by means of the method, the instantaneous pedaling frequency can thus be reliably determined in a particularly simple manner. Further advantages are also provided thereby. For example, in the presence of an additional pedaling frequency sensor, validation of the pedaling frequency signal detected with it can be performed. Furthermore, a validation of a speed signal can, e.g., be performed by the additional determination of the pedaling frequency enabling both parameters to be checked for plausibility.

Preferred embodiments of the disclosure are also set forth below.

The method preferably further comprises the following step: determining a characteristic frequency of the frequency spectrum of the movement signal. The determination of the pedaling frequency is performed on the basis of the determined characteristic frequency. In particular, a dominant frequency range of the frequency spectrum is considered to be a characteristic frequency, i.e., a frequency that is particularly dominant when the frequency spectrum is decomposed into its individual frequency components. The frequency can thus be determined based on the detected speed in a particularly simple and reliable manner.

Particularly preferably, the pedaling frequency is determined as half of the frequency of the characteristic frequency. In other words, the pedaling frequency is determined based on the assumption that per full pedal revolution, each of the two pedals is arranged exactly once, e.g., in the vertical pedal position in which the maximum rider torque is applied.

Preferably, the determination of the frequency spectrum is performed by means of a fast Fourier transformation (also abbreviated as FFT). It is thereby possible to analyze the movement signal with regard to its characteristic frequency components in order to determine the frequency spectrum and derive the pedaling frequency from it in a particularly simple and efficient manner.

Further preferably, the movement signal comprises a speed signal. Preferably, the determination of the speed signal is performed by means of a speed sensor. Preferably, the speed sensor is a reed sensor, in particular which is designed as a magnetic sensor. Preferably, the reed sensor generates a signal pulse per revolution of a wheel of the bicycle, wherein the speed can be determined based on the frequency of the signal pulses and a wheel circumference of the wheel. Alternatively or additionally preferably, the determination of the speed signal is performed by means of an anti-blocking sensor of an anti-blocking system of the bicycle, e.g. by means of a tonewheel. A particularly high chronological resolution of the speed and thus a particularly precise determination of the pedaling frequency can be provided as a result.

Preferably, the movement signal comprises an acceleration signal. Preferably, the determination of the acceleration signal is performed by means of an acceleration sensor, in particular an inertial sensor. In particular, an acceleration in the longitudinal direction, i.e., in the direction of travel, and/or an acceleration of a rolling movement can be detected by means of the acceleration sensor. In particular, a rolling movement is considered to be an inclination about the longitudinal axis, which is aligned in the direction of travel. A high chronological resolution and a precise determination of the pedaling frequency can be provided thereby.

Preferably, the method further comprises the following steps:

- determining a sensor pedaling frequency by means of a pedaling frequency sensor, and validating the pedaling frequency sensor based on a comparison between the determined pedaling frequency and the determined sensor pedaling frequency.

For example, the pedaling frequency sensor can be a revolution sensor configured to detect a frequency of a pedal revolution when a pedal is actuated. In other words, the sensor-based pedaling frequency signal of the pedaling frequency sensor and thus the correct function of the pedaling frequency sensor is thus validated by redundantly determining the pedaling frequency.

Preferably, the method further comprises the following step: performing a plausibility check of the determined movement signal by means of the determined pedaling frequency. In particular, the plausibility check is performed based on a previously known, e.g. instantaneous, gear ratio of a drive of the bicycle. In particular, the gear ratio is considered to be an overall gear ratio between a pedal drive and a rear wheel of the bicycle. In other words, a conversion between speed and pedaling frequency can thus be performed at a known instantaneous gear ratio. For example, a corresponding expected target pedaling frequency can be calculated based on the detected speed and the gear ratio. By additionally determining the pedaling frequency based on the frequency spectrum of the movement signal, a match or deviation of the correspondingly determined pedaling frequencies can be detected to simply and reliably check the plausibility of the speed detection based thereon. For example, a deviation between the respective determined pedaling frequencies from the speed and pedaling frequency sensor can also be interpreted as incorrect speed detection assuming a correct function of the pedaling frequency sensor, which can preferably be used for manipulation detection.

Particularly preferably, the method further comprises the following step: determining a manipulation of the movement signal in response to a determined implausibility of the movement signal. In other words, when checking the plausibility of the movement signal based on the pedaling frequencies, if it is determined that there is an implausibility, in particular of the respective frequencies, then it can be concluded that manipulation of the movement signal is taking place. This is particularly advantageous in the case of e-bike wheels, as it can, e.g., prevent misuse of the manipulated speed detection.

Preferably, the method further comprises the following step: determining a phase offset between the movement signal and a torque signal representing an instantaneous rider torque, or preferably between a movement signal and the total torque of measured rider torque and set motor torque. The torque signal can preferably be detected by means of a torque sensor. Further advantageous information can therefore be obtained based on the movement signal about the instantaneous driving state of the bicycle. In particular, the phase offset is representative of an elasticity and/or an inertia of the powertrain, i.e., a measure of the directness of the power transmission. For example, at a higher elasticity, the phase offset is greater, i.e., the speed signal is lagging behind the torque signal even more.

Preferably, the plausibility check of the determined movement signal is performed additionally based on the determined phase offset. For example, at an unexpected, i.e. implausible, phase offset, a manipulation of the speed signal can also be detected. In this case, for example, a comparison of the determined phase offset using a predetermined reference value, and/or using calibration data, and/or using a lookup table can be performed in order to check the plausibility of the phase offset.

Furthermore, the disclosure results in a method for operating a drive unit of an e-bike. The drive unit is in particular configured to motorically assist a rider torque generated by the muscle power of a rider of the e-bike with a motor torque. Particularly preferably, the motor torque is generated on the basis of the driving parameters of the e-bike, in particular based at least in part on an instantaneous speed of the e-bike. Preferably, motor torque generation occurs only up to a predetermined maximum speed. The method for operating the drive unit comprises the following steps:

determining a pedaling frequency of the e-bike by means of the method described hereinabove for determining a pedaling frequency of a bicycle, and actuating the drive unit on the basis of the determined pedaling frequency.

In particular, the generated motor torque is controlled on the basis of the determined pedaling frequency. The drive unit can thereby be controlled in a particularly simple and efficient manner and with particular precision. The special determination of the pedaling frequency by means of the method according to the disclosure provides in particular the advantage that manipulations of the motor assistance (i.e., what is referred to as "tuning") can be detected and/or prevented in a simple and effective manner.

Preferably, the method further comprises the following step: deactivating the drive unit in response to a determined manipulation of the movement signal, which can preferably be determined in response to a determined implausibility of the movement signal, as described hereinabove. In other words, in the event of a determined manipulation of the movement signal, it is prevented that a motor torque can be generated by means of the drive unit.

The disclosure further relates to a bicycle comprising a speed sensor and/or an inertial sensor means for generating a speed signal representing an instantaneous speed of the bicycle, and a control unit. Preferably, the bicycle is an e-bike, preferably further comprising a drive unit. In this case, the control unit is preferably further configured to operate the drive unit in a controlled manner. The control unit is in this case configured to perform the described method for determining a pedaling frequency and/or the described method for operating a drive unit.

BRIEF DESCRIPTION OF THE DRAWINGS

Exemplary embodiments of the disclosure are described in detail in the following with reference to the accompanying drawings. The drawings include.

DETAILED DESCRIPTION

Figure 1:
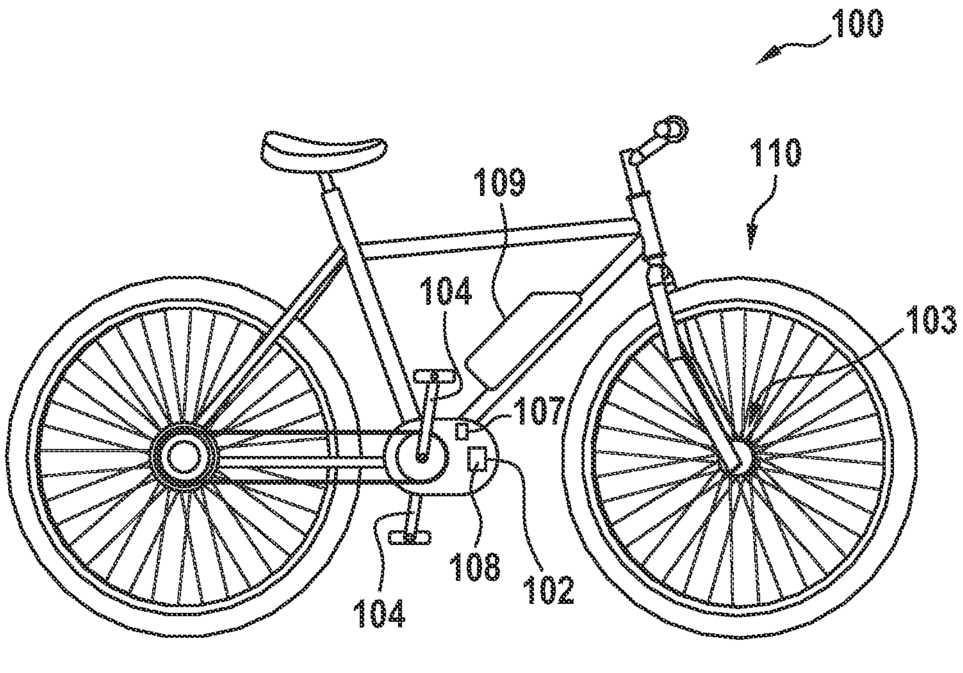
FIG. 1 a simplified schematic view of a bicycle in which a method to determine a pedaling frequency according to a preferred exemplary embodiment of the disclosure is performed, FIG. 2 a simplified representation of exemplary chronological progressions of sensor signals used in performing the method according to the preferred exemplary embodiment, FIG. 3 an exemplary chronological progression of a speed signal used in performing the method according to the preferred embodiment, FIG. 4 an exemplary frequency spectrum of the speed signal in FIG. 3 used in performing the method according to the preferred embodiment, and FIG. 5 exemplary chronological progressions of a filtered torque signal and a filtered speed signal used in performing the method according to the preferred embodiment.

FIG. 1 shows a simplified schematic view of a bicycle 100. The bicycle 100 is an e-bike which comprises a drive unit 102 designed as an electric motor. The drive unit 102 is arranged in the region of a bottom bracket of the bicycle 100 and is provided to assist a manual pedal force of a rider of the electric bicycle 100 applied via a crank drive 104 with a torque generated by an electric motor.

Further, the bicycle 100 comprises an electrical energy accumulator 109 by means of which the drive unit 102 is supplied with electrical energy. A control unit 108 is also integrated into the drive unit 102.

The control unit 108 is in this case configured to operate the drive unit 102 on the basis of the pedaling operation of a rider of the bicycle 100. Specifically, the drive unit 102 is actuated in a controlled manner such that a motor torque is generated on the basis of a rider torque generated by the rider's muscle power to provide motor assistance to the rider as they pedal. It is provided that the motor torque generation is controlled on the basis of an amount of rider torque. Further, actuation of the drive unit 102 can depend on further parameters, e.g. a pedaling frequency.

In addition, actuation of the drive unit 102 is performed only up to a predetermined maximum speed, preferably 25 km/h. If the predetermined maximum speed is exceeded, then motor torque generation is stopped by means of the drive unit 102, e.g. by deactivating the drive unit 102.

When operating the drive unit 102, the method for determining a pedaling frequency of the bicycle 100 according to the preferred embodiment of the disclosure is performed. The pedaling frequency determined in this way can, e.g., be used to detect manipulation of the speed-dependent control of the drive unit 102 in a simple and reliable manner. This is described in detail hereinafter.

In the method, a speed signal 2 is first determined by means of a speed sensor 103. The speed sensor 103 in the preferred embodiment described is an anti-blocking sensor of an anti-blocking system 110 of the bicycle 100. The speed signal 2 can therefore be detected particularly precisely and at a high chronological resolution. Alternatively or additionally preferably, the speed signal 2 can be detected by means of a reed sensor acting as a speed sensor.

Figure 2:
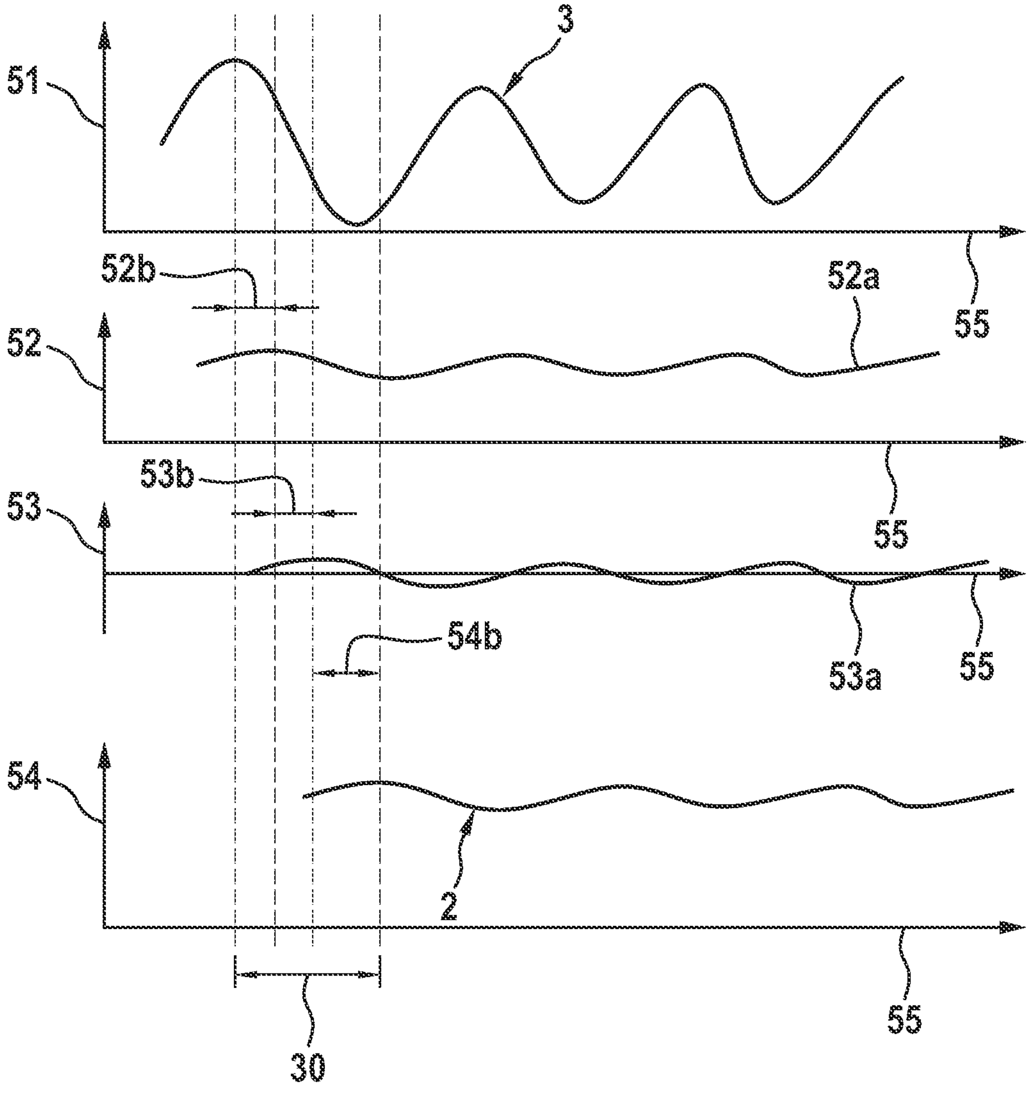
Figure 3:
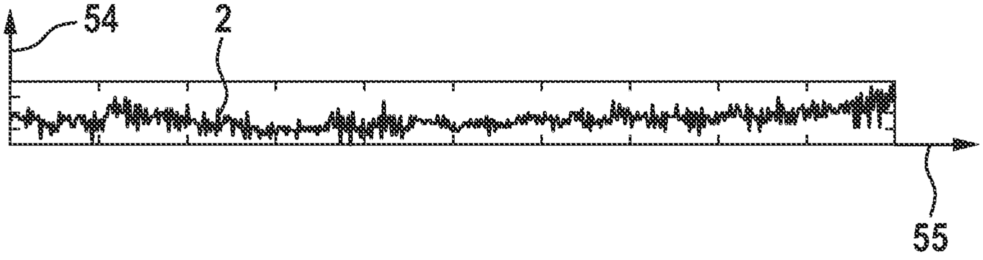

An exemplary progression for a detected speed signal 2 is shown in FIGS. 2 and 3. For example, at the bottom FIG. 2 and in FIG. 3, the speed 54 is shown as a function of time 55.

In the method, a frequency spectrum 20 of the speed signal 2 is then determined. The determination of the frequency spectrum 20 is performed by means of a fast Fourier transformation. The frequency spectrum 20 of the speed signal in FIG. 3 determined in this way, i.e., on the basis of the frequency 75 of particular frequencies 56 occurring in the speed signal 2, as shown in FIG. 4.

Figure 4:
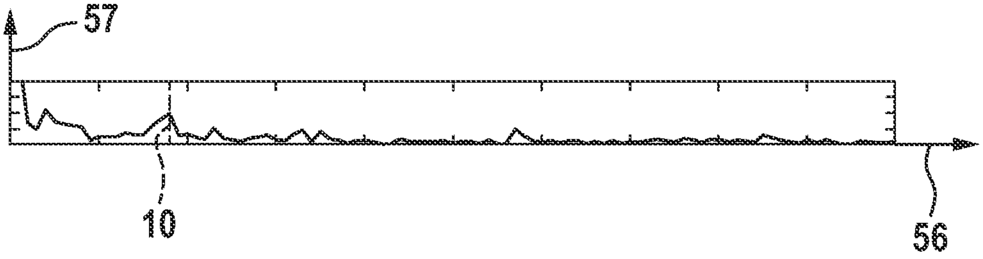

As can be seen in FIG. 4, a peak of the frequency distribution is present at a characteristic frequency 10. Half of this characteristic frequency corresponds to the pedaling frequency to be determined at which the rider of the bicycle 100 pedals.

This determination is based on the assumption that the instantaneous speed of the bicycle 100 will fluctuate due to pedaling by the rider. In this case, the corresponding pedal torque applied as the rider pedals is in particular based on the instantaneous pedal position. In other words, when the pedal is in a horizontal position, the maximum pedaling torque is generated by the rider's maximum pedaling force in this position, whereas the lowest pedal torque is generated in the vertical position.

Such a fluctuating torque progression can also be seen in FIG. 2, in which a torque signal 3 representing the torque progression is shown in the uppermost diagram. In this case, the instantaneous rider torque 51 is shown as a function of time 55.

By means of the determined pedaling frequency, the speed signal 2, which is detected by means of the speed sensor 103, can subsequently be checked for plausibility. In particular, this can be performed on the basis of an instantaneous, previously known gear ratio of a drive of the bicycle 100. For example, based on the previously known gear ratio, an expected instantaneous speed can be calculated based on the determined pedaling frequency. By comparing the speed calculated in this way with the instantaneous speed of the speed signal 2, validation of the speed signal 2 can be performed. Given implausibility of the speed signal 2, manipulation of speed detection can, e.g., as a result be concluded. If such manipulation is detected, then further measures can be taken, e.g., deactivating the drive unit 102 in order to, e.g., reliably prevent motor assistance above the predetermined maximum speed.

Validation of a dedicated pedaling frequency sensor 107 can also be performed by the pedaling frequency determined based on speed detection in a particularly simple and cost-effective manner.

Figure 5:
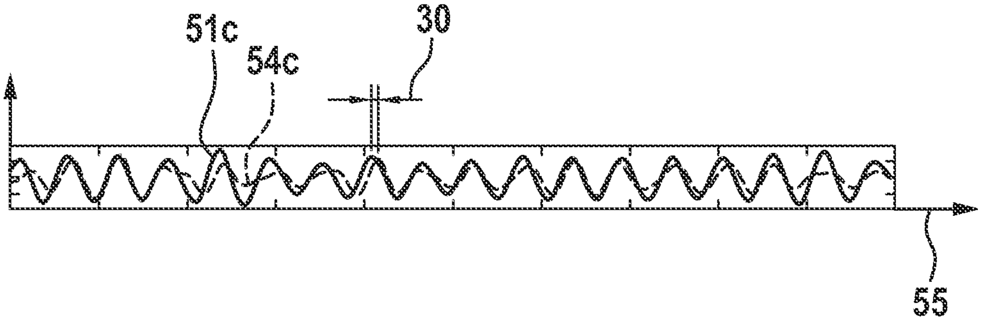

Further optimization of the method can be performed by additionally detecting the torque signal 3 representing the instantaneous rider torque. A phase offset 30 can be determined between the determined speed signal 2 and the torque signal 3, as shown in FIG. 2. The phase offset 30 can also be seen in FIG. 5, which shows a filtered torque signal 51*c* and a filtered speed signal 54*c*.

This phase offset 30 results from mechanical and/or climatic relationships of the power transmission between pedal actuation by the muscle power of the rider and the drive on the rear wheel of the bicycle 100. For example, this entire phase offset 30 divides into multiple individual phase offsets, as described hereinafter.

The second chart in FIG. 2 shows a total torque progression 52*a*, which is a total torque 52, which is a sum of the rider torque 51 and a generated motor torque of the drive unit 102 over time 55. Between the torque signal 3 and the total torque progression 52*a*, a first phase offset 52*b* by torque filtration in the motor controller of the drive unit 102 results.

The third chart in FIG. 2 shows an acceleration progression 53*a* indicative of an acceleration 53 of the bicycle 100 as a function of time 55. Between the total torque progression 52*a* and the acceleration progression 53*a*, a second phase offset 53*b* results from an inertia and/or elasticity and frictional influences in the drive train of the bicycle 100.

Further shown in FIG. 2 is a third phase offset 54*b* between the acceleration progression 53*a* and the speed signal 2, which results from the physical relationship of the lagging of the speed with respect to the acceleration.

A total of the entire phase offset 30 therefore results between the torque signal 3 and the speed signal 2.

Based on the corresponding determination of the phase offset 30 and the previously known mechanical and kinematic properties of the drive of the bicycle 100, a plausibility check of the determined speed signal 2 can also be performed. For example, this check can be performed by comparing the determined phase offset 30 with an expected phase offset which can, e.g., be calculated, or specified as a predetermined value, or determined from a table.

What is claimed is:

1. A method for determining a pedaling frequency of a bicycle, comprising:

determining a movement signal representing a chronological progression of a locomotion of the bicycle;

determining a frequency spectrum of the movement signal;

determining a pedaling frequency based on the determined frequency spectrum:

performing a plausibility check for the determined movement signal; and determining a manipulation of the movement signal in response to a determined implausibility of the movement signal.

2. The method according to claim 1, further comprising determining a characteristic frequency of the frequency spectrum of the movement signal, wherein determining the pedaling frequency is based on the determined characteristic frequency.

3. The method according to claim 2, wherein the pedaling frequency is determined as half of the frequency of the characteristic frequency.

4. The method according to claim 1, wherein determining the frequency spectrum is performed by way of a fast Fourier transformation.

5. The method according to claim 1, wherein:

the movement signal comprises a speed signal, and the determination of the speed signal is performed by way of a speed sensor.

6. The method according to claim 1, wherein:

the movement signal comprises an acceleration signal, and the determination of the acceleration signal is performed by way of an acceleration sensor.

7. The method according to claim 1, further comprising:

determining a sensor pedaling frequency by way of a pedaling frequency sensor; and validating the pedaling frequency sensor based on a comparison between the determined pedaling frequency and the determined sensor pedaling frequency.

8. The method according to claim 1, wherein:

the plausibility check for the determined movement signal is based on the determined pedaling frequency based on a previously known gear ratio of a drive of the bicycle.

9. The method according to claim 1, further comprising:

determining a phase offset between the movement signal and a torque signal, which offset represents an instantaneous rider torque or a total torque.

10. The method according to claim 9, wherein the plausibility check is performed additionally based on the determined phase offset.

11. The method according to claim 1, wherein the bicycle is an e-bike.

12. The method according to claim 1, wherein:

the movement signal comprises a speed signal, and the determination of the speed signal is performed by way of an anti-blocking sensor.

13. The method according to claim 1, wherein:

the movement signal comprises an acceleration signal, and the determination of the acceleration signal is performed by way of an inertial sensor.

14. A method for operating a drive unit of a bicycle, comprising:

determining a pedaling frequency of the bicycle by way of a method according to claim 1; and actuating the drive unit on the basis of the determined pedaling frequency.

15. The method according to claim 14, further comprising:

deactivating the drive unit in response to a determined manipulation of the movement signal.

16. A bicycle, comprising:

a speed sensor and/or an inertial sensor means for generating a movement signal representing a chronological progression of a locomotion of the bicycle; and a control unit configured to perform a method according to claim 1.

17. A method for determining a pedaling frequency of a bicycle, comprising:

determining a movement signal representing a chronological progression of a locomotion of the bicycle;

determining a frequency spectrum of the movement signal;

determining a pedaling frequency based on the determined frequency spectrum:

performing a plausibility check for the determined movement signal; and determining a phase offset between the movement signal and a torque signal, which offset represents an instantaneous rider torque or a total torque.

18. The method of claim 17, further wherein:

the plausibility check for the determined movement signal is based on the determined pedaling frequency based on a previously known gear ratio of a drive of the bicycle.

* * * * *